(12) United States Patent
Reinberg (10) Patent No.: US 7,173,317 B1
(45) Date of Patent: Feb. 6, 2007

(54) ELECTRICAL AND THERMAL CONTACT FOR USE IN SEMICONDUCTOR DEVICES

(75) Inventor: Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 1110 days.

(21) Appl. No.: 09/189,098

(22) Filed: Nov. 9, 1998

(51) Int. Cl.
    *H01L 29/00* (2006.01)
(52) U.S. Cl. .................. 257/530; 438/600; 438/601
(58) Field of Classification Search ............. 257/530; 438/600, 601
    See application file for complete search history.

(56) References Cited

U.S. PATENT DOCUMENTS

| | | | |
|---|---|---|---|
| 4,590,589 A | | 5/1986 | Gerzberg |
| 4,770,977 A | * | 9/1988 | Buiguez et al. ............. 430/323 |
| 5,208,177 A | | 5/1993 | Lee |
| 5,250,459 A | | 10/1993 | Lee |
| 5,264,725 A | | 11/1993 | Mullarkey et al. |
| 5,296,716 A | | 3/1994 | Ovshinsky et al. |
| 5,451,811 A | * | 9/1995 | Whitten et al. ............. 257/530 |
| 5,485,031 A | | 1/1996 | Zhang et al. |
| 5,486,707 A | | 1/1996 | Look et al. |
| 5,521,423 A | | 5/1996 | Shinriki et al. |
| 5,631,862 A | | 5/1997 | Cutter et al. |
| 5,760,462 A | | 6/1998 | Barron et al. |
| 5,761,115 A | | 6/1998 | Kozicki et al. |
| 5,789,277 A | | 8/1998 | Zahorik et al. |
| 5,789,758 A | | 8/1998 | Reinberg |
| 5,792,594 A | * | 8/1998 | Brown et al. ............... 430/315 |
| 5,920,788 A | | 7/1999 | Reinberg ................... 438/466 |
| 5,956,609 A | * | 9/1999 | Lee et al. .................. 438/627 |
| 6,025,220 A | | 2/2000 | Sandhu ...................... 438/237 |
| 6,077,729 A | | 6/2000 | Harshfield ................. 438/128 |

FOREIGN PATENT DOCUMENTS

JP          04045585 A  *   2/1992   ................. 257/30

* cited by examiner

Primary Examiner—Howard Weiss
(74) Attorney, Agent, or Firm—TraskBritt (57) ABSTRACT

An electrical and thermal contact for use in a semiconductor device. The electrical and thermal contact includes an intermediate conductive layer, an insulator component, and a contact layer. The intermediate conductive layer may contact a structure of the semiconductor device. The insulator component, which is fabricated from a thermally and electrically insulative material, may be sandwiched between the intermediate conductive layer and the contact layer, which may substantially envelop the insulator component. The electrical and thermal contact may be fabricated by a process which includes forming a first thin layer on a surface of the semiconductor device, depositing a dielectric layer adjacent the first thin layer, patterning the dielectric layer to define the insulator component, forming a second thin layer adjacent the insulator component and in partial contact with the first thin layer, and patterning the first and second thin layers to define the intermediate conductive layer and the contact layer, respectively. Due to its structure, which requires relatively little electrical current to generate a desired amount of heat, the electrical and thermal contact effectively contains heat within and prevents heat from dissipating from a contacted structure, and is particularly useful for contacting and inducing a change in the electrical conductivity of structures which include phase change materials.

60 Claims, 5 Drawing Sheets

ELECTRICAL AND THERMAL CONTACT FOR USE IN SEMICONDUCTOR DEVICES

BACKGROUND OF THE INVENTION

1. Field of the Invention

The present invention relates to an electrical and thermal contact for use in semiconductor devices. Particularly, the present invention relates to an electrical and thermal contact which reduces the amount of energy input that is required in order to switch a semiconductor device structure that is contacted thereto between two or more states. More specifically, the electrical and thermal contact of the present invention includes thin conductive layers which envelop an insulator component. The electrical and thermal contact is particularly useful for switching contacted structures that include a phase change component between two or more states of electrical conductivity.

2. Background of Related Art

Electrically erasable programmable memory devices (EEPROMS) typically include several memory elements that may be switched between a first logic state and a second logic state. A first logic state may be an inactive state, or an "off" state, wherein electrical impulses do not travel across the memory element. Memory elements may be said to be in a second logic state, such as an "activated" state or an "on" state, when low voltage electrical impulses (i.e., of the operational voltage of the EEPROM) will readily travel thereacross.

Memory elements may comprise fuse elements or antifuse elements. Fuse elements are programmed by "blowing" (i.e., breaking the electrical connection across) the fuse thereof, which switches the fuse elements from an active state to an inactive state. Conversely, antifuse elements are programmed by forming a low resistance electrical path across (i.e., activating) the antifuses thereof. The programming of both fuse and antifuse elements requires the application of a sufficient current and voltage to such memory elements. Nevertheless, the application of too great a current to memory elements, such as fuse and antifuse elements, increases the potential that various other components of the EEPROM of which they are a part, including without limitation the gate oxide layer, transistors, and other structures on the surface thereof, may be damaged.

Figure 1:
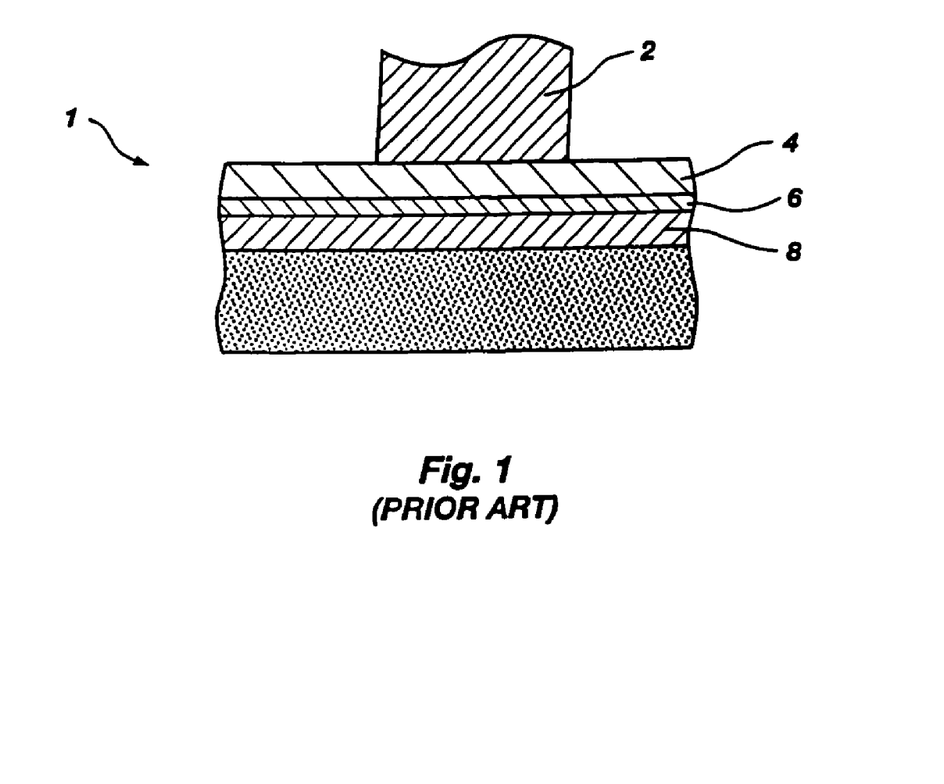
FIG. 1 is a schematic representation of an exemplary conventional antifuse element.

FIG. 1 is a schematic representation of an exemplary conventional antifuse element 1, which includes a metal contact 2, first and second electrodes 4 and 8, respectively, and a dielectric layer 6, which electrically insulates the first electrode 4 from the second electrode 8. Metal contact 2 is typically a large element relative to the remainder of antifuse element 1. As a current is applied to metal contact 2, the resistance that is generated thereby and by at least one of the electrodes 4, 8 that are in contact therewith locally heats dielectric layer 6, destroying at least a portion of the same and facilitating the formation of an electrically conductive pathway between first electrode 4 and second electrode 8. Thus, an electrical contact is established between first and second electrodes 4 and 8, respectively, thereby activating antifuse element 1.

As noted previously, programming pulses which comprise high electrical voltages may damage various components of an EEPROM, including, without limitation, the gate oxide layer, transistors and other structures on the surface of the EEPROM. Consequently, in order to reduce the potential for damaging EEPROMs during the programming thereof, the programming pulses for EEPROMs are ever-decreasing, as are the normal operating voltages thereof. State of the art EEPROMs typically operate at either 5V or 3.3V. U.S. Pat. No. 5,486,707, issued to Kevin T. Look et al. on Jan. 23, 1996, discloses an exemplary programmable memory that includes antifuse elements that may be switched to an "on" state by a programming voltage of about 7.5V to about 10V. While in the "off" state, the electrical resistance of a typical EEPROM antifuse element is on the order of about 1 gigaohm or greater. After an antifuse of a typical state of the art EEPROM has been switched to the "on" state by a programming pulse, the former has a low electrical resistance, on the order of tens of ohms or less.

The memory elements of such state of the art EEPROMs typically have lower programming voltage requirements than their predecessors, due to the structure of the memory elements of the former and the materials that are utilized in the memory elements. While the programming voltage requirements of such EEPROMs are ever-decreasing, due to the widespread use of conventional, low thermal impedance metal contacts in connection with the antifuse elements thereof, an extremely high current is typically required in order to generate a sufficient temperature to activate such antifuse elements. Further, due to the high rate at which many conventional metal contacts dissipate heat, such contacts may necessitate the input of even greater amounts of current in order to adequately heat and activate an antifuse element. Moreover, the typical use of conventional, relatively large metal contacts on such EEPROMs is somewhat undesirable from the standpoint that such contacts consume a great deal of surface area or "real estate" on the surface of the semiconductor device. Thus, conventional metal contacts limit the density of active device regions on the semiconductor device.

The dissipation of heat away from the memory cell through the metal contact is especially undesirable when the memory cell includes a phase change component, such as a chalcogenide material layer, such as the EEPROM devices disclosed in U.S. Pat. No. 5,789,758 (hereinafter "the '758 patent"), which issued to Alan R. Reinberg on Aug. 4, 1998. As is known in the art, chalcogenide materials and some other phase change materials exhibit different electrical characteristics depending upon their state. For example, chalcogenide materials have a lower electrical conductivity in their amorphous state, or phase, than in their crystalline state. Chalcogenide materials may be changed from an amorphous state to a crystalline state by increasing their temperature. The electrical conductivity of the material may vary incrementally between the amorphous state and the crystalline state.

Some EEPROMs include metal contacts that are offset from the active device regions of the former. Such offset contacts are said to reduce the dissipation of thermal energy from the active device regions. Although the direct dissipation of heat from the active device regions of such EEPROM structures may be reduced, thermal energy is conducted to the offset metal contacts, which dissipate heat at approximately the same rate as conventionally positioned metal contacts.

Thus, an electrical and thermal contact is needed which facilitates the input of reduced current and voltage into a structure that is electrically contacted thereto (i.e., conserves energy) and which has a low rate of thermal dissipation relative to conventional metal contacts. A more compact electrical and/or thermal contact structure is also needed.

SUMMARY OF THE INVENTION

The electrical and thermal contact of the present invention addresses each of the foregoing needs. The electrical and thermal contact of the present invention contacts a structure of a semiconductor device, such as a phase change component of an active device region thereof, as disclosed in the '758 Patent and in U.S. Pat. No. 5,789,277 ("the '277 patent"), which issued to Zahorik et al. on Aug. 4, 1998, the disclosures of both of which are hereby incorporated by reference in their entirety. The electrical and thermal contact of the present invention includes an intermediate conductive layer adjacent the contacted structure, a thermal insulator component, which is also referred to as an insulator component, that is adjacent the intermediate conductive layer, and a contact layer that is adjacent the thermal insulator component and which partially contacts the intermediate conductive layer. Preferably, the contact layer and intermediate conductive layer are in electrical and thermal communication with the contacted structure. The thermal insulator component is preferably sandwiched between the intermediate conductive layer and the contact layer, such that the thermal insulator component is substantially enveloped by the intermediate conductive and contact layers. An exemplary active device region to which the electrical and thermal contact of the present invention may be contacted is a memory cell, or element, of an EEPROM device.

Fabricating the electrical and thermal contact includes forming a dielectric layer around the lateral peripheral portions of a semiconductor device structure to be contacted, patterning the dielectric layer to expose at least a portion of the semiconductor device structure to be contacted, such as an active device region thereof, depositing a first thin conductive layer, depositing another dielectric layer adjacent the first thin conductive layer, patterning the dielectric layer to define a thermal insulator component, depositing a second thin conductive layer adjacent the thermal insulator component and in electrical communication with the first thin conductive layer, and patterning the first and second thin conductive layers to define the intermediate conductive layer and the contact layer, respectively. The dielectric layer is fabricated from an electrically and thermally conductive material. Preferably, during patterning of the dielectric layer, the first thin conductive layer is utilized as an etch stop. The processes that may be employed to fabricate the electrical and thermal contact facilitate the fabrication of a relatively small electrical and thermal contact when compared with conventional metal contacts.

Other advantages of the present invention will become apparent to those of ordinary skill in the relevant art through a consideration of the ensuing description, the accompanying drawings, and the appended claims.

DETAILED DESCRIPTION OF THE PREFERRED EMBODIMENTS

Figure 2:
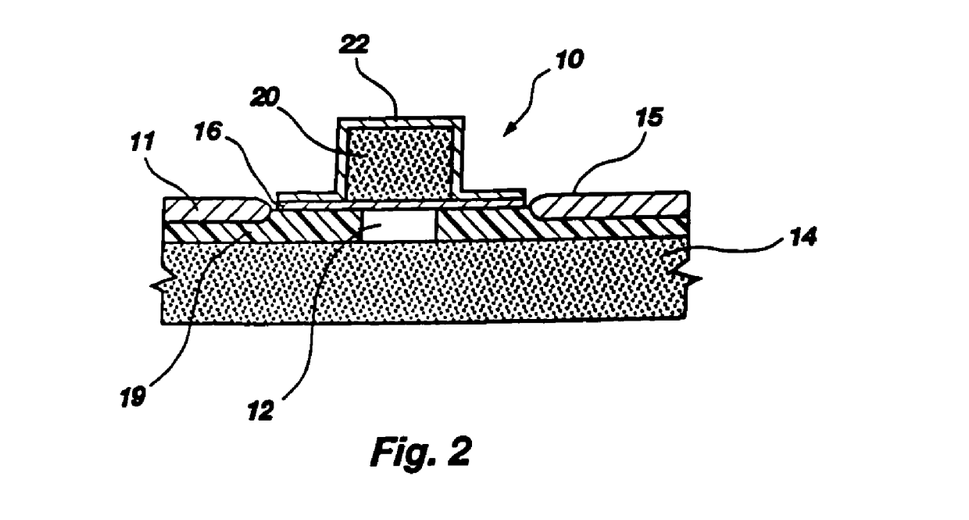
FIG. 2 is a cross-section of a contact according to the present invention, depicting the association of the contact with a contacted structure on the surface of a semiconductor device.
Figure 3:
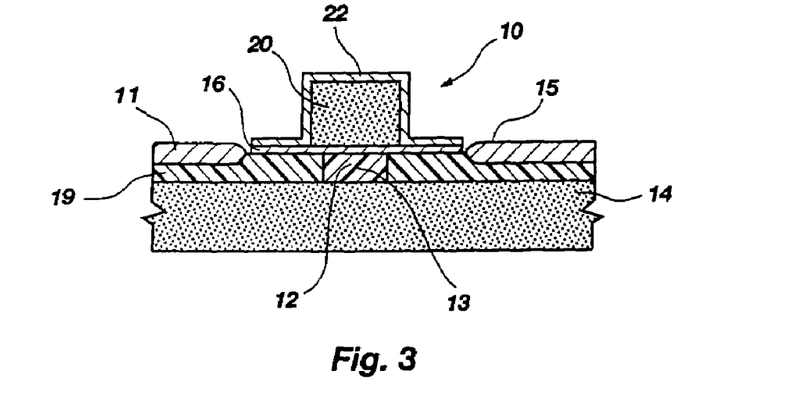
FIG. 3 is a cross-section of a variation of the semiconductor device of FIG. 2, the contacted structure of which includes a phase change component.

The present invention comprises an electrical and thermal contact for a contacted structure of a semiconductor device. With reference to FIGS. 2 and 3, in a preferred embodiment, the electrical and thermal contact 10 is disposed on a surface 15 of a semiconductor device 14. Electrical and thermal contact 10 may be positioned adjacent a contacted structure 12, such as an antifuse or other memory element, that is exposed through oxide layer 11, such that it electrically and thermally contacts the contacted structure 12. Preferably, electrical and thermal contact 10 contacts an electrically conductive phase change component 13 of contacted structure 12 (FIG. 3), such as the memory element disclosed in the '758 patent. Preferably, contacted structure 12 includes a dielectric element 19 surrounding the lateral peripheral portions of phase change component 13 to thermally and electrically insulate the latter.

Electrical and thermal contact 10 includes a thin, intermediate conductive layer 16, disposed adjacent contacted structure 12, a thermal insulator component 20 positioned adjacent intermediate conductive layer 16, and a thin, electrically conductive contact layer 22 disposed adjacent thermal insulator component 20. Preferably, thermal insulator component 20 is sandwiched between intermediate conductive layer 16 and contact layer 22, such that thermal insulator component 20 is substantially enveloped by the intermediate and contact layers.

Phase change component 13 is preferably fabricated from an electrically conductive phase change material, such as amorphous silicon or a so-called "chalcogenide" alloy, which typically includes at least one of germanium, antimony, selenium, and tellurium. Such materials exhibit different electrical characteristics, depending upon their state. For example, phase change materials such as chalcogenides exhibit greater electrical conductivity when in a crystalline phase than in an amorphous phase.

Intermediate conductive layer 16 is positioned such that it electrically contacts phase change component 13 and establishes electrical communication between contact layer 22 and contacted structure 12. Intermediate conductive layer 16 is fabricated from an electrically conductive material and preferably has a thickness of about 200 Å or less. Preferably, in order to maintain the structural integrity of intermediate conductive layer 16 during the operation of semiconductor device 14, the material from which intermediate conductive layer 16 is fabricated has a melting point that is higher than both the ambient temperature at which semiconductor device 14 operates and the phase change temperature of phase change component 13. An exemplary material that may be used to fabricate intermediate conductive layer 16 is titanium nitride (TiN), which may be deposited in highly conformal layers of about 200 Å or less by techniques that are known in the art, such as chemical vapor deposition processes. Other materials that may be used to define intermediate conductive layer 16 include, without limitation, tungsten, titanium, other refractory metals, other refractory metal nitrides, metal alloys and other materials which are useful as electrically conductive traces on semiconductor devices.

Thermal insulator component 20 is disposed upon intermediate conductive layer 16 and is preferably positioned over contacted structure 12. Thermal insulator component 20 may be fabricated from a thermally insulative material, such as a silicon oxide (e.g., $SiO_2$), a doped silicon oxide (e.g., borophosphosilicate glass (BPSG), phosphosilicate glass (PSG), borosilicate glass (BSG)), silicon nitride, thermoset resins, thermoplastic polymers, and other dielectric materials which exhibit good thermal insulative properties.

Contact layer 22 is preferably disposed over the entire surface of thermal insulator component 20 and over the exposed portions of intermediate conductive layer 16 that are adjacent to thermal insulator component 20. Contact layer 22 is fabricated from an electrically conductive material that preferably has a thickness of about 200 Å or less. Preferably, in order to maintain the structural integrity of contact layer 22 during the operation of semiconductor device 14, the material from which the contact layer 22 is fabricated has a melting point that is higher than both the ambient temperature at which semiconductor device 14 operates and the phase change temperature of phase change component 13. An exemplary material from which contact layer 22 may be fabricated is titanium nitride (TiN), which may be deposited in highly conformal layers of about 200 Å or less by techniques that are known in the art, such as chemical vapor deposition processes. Alternatively, contact layer 22 may be manufactured from materials including, without limitation, aluminum, tungsten, titanium, other refractory metals, other refractory metal nitrides, metal alloys and other materials that are useful as electrically conductive traces in semiconductor device applications.

Turning now to FIGS. 4 through 8, a process for fabricating electrical and thermal contact 10 is described and illustrated.

Figure 4:
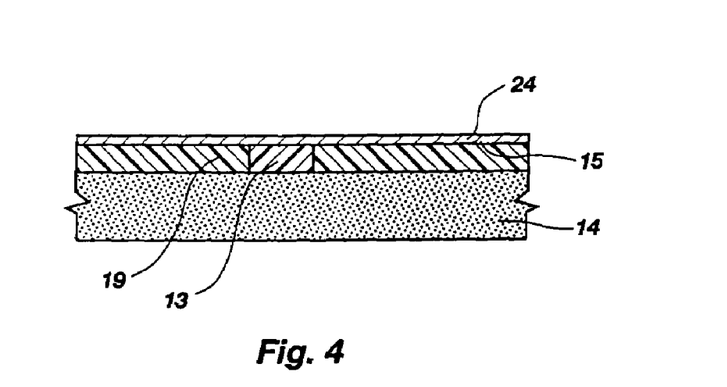
FIG. 4 is a cross-section of a semiconductor device, depicting the formation of a first thin layer of electrically conductive material over the phase change component of FIG. 3.

Referring now to FIG. 4, in order to form intermediate conductive layer 16 (see FIGS. 2 and 3), a first thin layer 24 of thermally and electrically conductive material is deposited on surface 15 of semiconductor device 14, such that it contacts portions of phase change component 13 that are exposed. First thin layer 24 may be formed by techniques that are known in the art which are capable of depositing an electrically conductive layer formed of a desired material and having a desirable thickness and conformity. Thin-film deposition techniques that are useful for forming first thin layer 24 include, without limitation, chemical vapor deposition (CVD) processes (e.g., atmospheric pressure CVD, low pressure CVD, plasma-enhanced CVD) and sputtering, or physical vapor deposition, processes. Such techniques typically blanket-deposit a layer of the desired material over the entire surface of a semiconductor device or larger substrate including a multitude of such devices, including any exposed contacted structures thereof.

Figure 5:
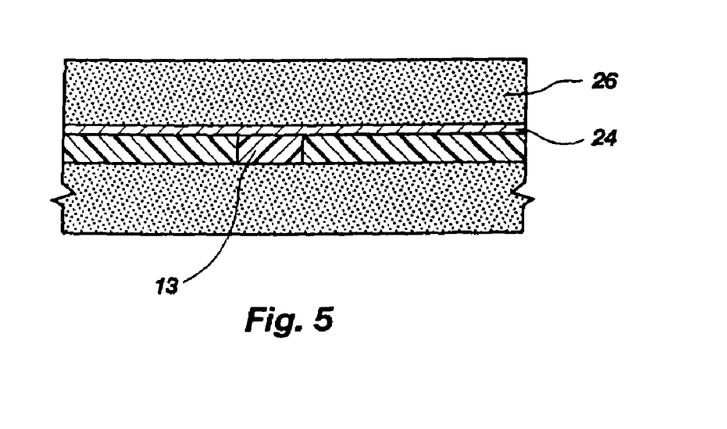
FIG. 5 is a cross-section of a semiconductor device, depicting the formation of a dielectric layer over the first thin layer of FIG. 4.

FIG. 5 illustrates the deposition of a dielectric layer 26 adjacent first thin layer 24. Preferably, dielectric layer 26 is deposited upon first thin layer 24. As described in greater detail below, thermal insulator component 20 (see FIGS. 2 and 3) will be defined from dielectric layer 26. Dielectric layer 26, which comprises a thermally insulative material, such as those disclosed previously in reference to FIGS. 2 and 3, may be deposited adjacent first thin layer 24 across the contact by techniques that are known to those in the art, such as chemical vapor deposition processes. Dielectric layer 26 has a thickness that will provide the desired amount of heat retention proximate phase change component 13 at a desirable temperature to effect the desired phase change and consequent change in the electrical conductivity of phase change component 13.

Figure 6:
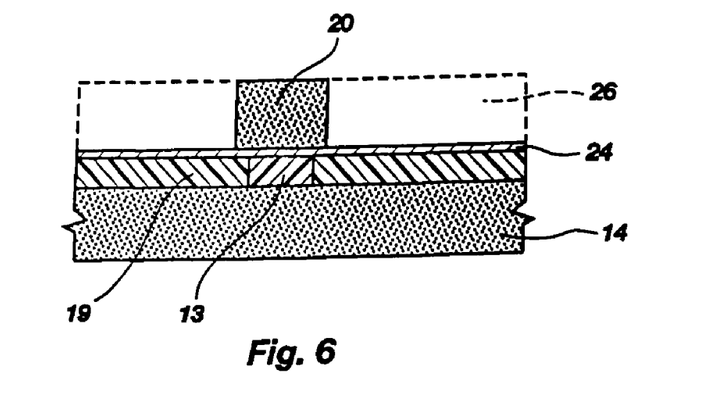
FIG. 6 is a cross-section of a semiconductor device, depicting the patterning of the dielectric layer of FIG. 5.

With reference to FIG. 6, dielectric layer 26, which is depicted by broken lines, is patterned to define one or more distinct thermal insulator components 20 of desired dimensions which are positioned in desired locations upon semiconductor device 14. Processes that are known in the art, such as masking and etching, are employed to pattern dielectric layer 26 and define one or more thermal insulator components 20 therefrom. Preferably, first thin layer 24 is utilized as an etch stop while defining one or more thermal insulator components 20 from dielectric layer 26.

Figure 7:
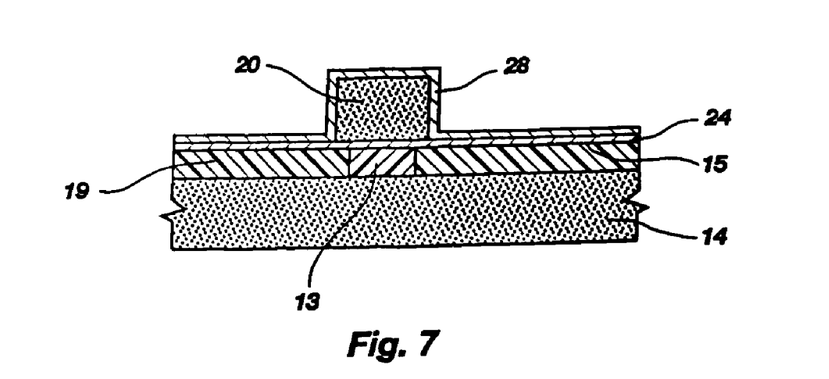
FIG. 7 is a cross-section of a semiconductor device, depicting the formation of a second thin layer of electrically conductive material over the patterned dielectric layer and first thin layer of FIG. 6.

Turning to FIG. 7, a second thin layer 28 of thermally and electrically conductive material is then deposited adjacent thermal insulator component 20. Second thin layer 28 is preferably deposited conformally and in substantially uniform thickness over surface 15 of semiconductor device 14 (or larger substrate as noted above), including substantially over the exposed areas of the thermal insulator component 20 and upon the exposed portions of first thin layer 24. Second thin layer 28 may be formed by techniques that are known in the art which are capable of depositing an electrically conductive layer formed of a desired material and having a desirable thickness and conformity. Thin-film deposition techniques that are useful for forming second thin layer 28 include, without limitation, chemical vapor deposition (CVD) processes and sputtering processes. Such techniques typically blanket-deposit a layer of the desired material over the entire surface 15 of semiconductor device 14.

Figure 8:
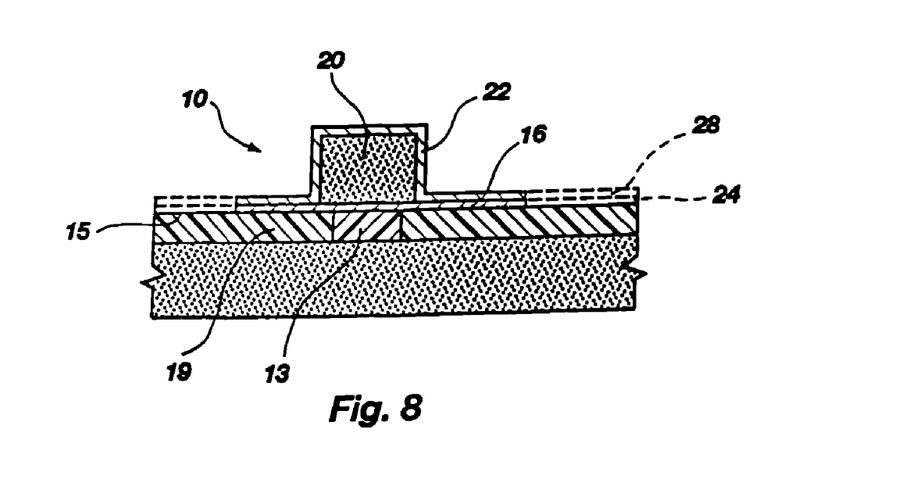
FIG. 8 is a cross-section of a semiconductor device, depicting the patterning of the first and second layers of FIG. 7.

Referring now to FIG. 8, first and second thin layers 24 and 28 are patterned to define intermediate conductive layer 16 and contact layer 22 of each distinct electrical and thermal contact 10 on surface 15, as well as any electrical traces (not shown) that are in electrical contact with the electrical and thermal contacts. First and second thin layers 24 and 28 may be patterned by techniques that are known in the art, such as masking and etching.

The processes that may be employed to fabricate electrical and thermal contact 10 facilitate the fabrication of a structure that is relatively small when compared to the size of conventional metal contacts. Similarly, electrical and thermal contact 10 may be fabricated by processes that form and define structures of various dimensions. The thermal and electrical conductivity of electrical and thermal contact 10 is dependent upon several factors, including, without limitation, the thickness of first and second thin layers 24 and 28, the height and mass of the thermal insulator component 20, and various characteristics of the materials from which intermediate conductive layer 16, contact layer 22 and thermal insulator component 20 are fabricated.

Referring again to FIG. 3, as noted previously, the disposition of electrical and thermal contact 10 adjacent and in direct contact with phase change component 13 of contacted structure 12 facilitates a reduction in the overall amounts of current and heat that are required to operate or activate contacted structure 12 relative to the respective amount of current that is typically required by many semiconductor devices which include conventional heavy electrical contacts over contacted chalcogenide memory elements. Many conventional electrical contacts dissipate substantial amounts of thermal energy into the surrounding environment and, thus, away from the structures in contact therewith.

In contrast, the thin electrically conductive layers (i.e., intermediate conductive layer 16 and contact layer 22) and the thermal insulator component 20 of electrical and thermal contact 10 effectively retain thermal energy in contacted structure 12. The thin intermediate conductive layer 16 and contact layer 22 each exhibit high impedances relative to conventional metal contacts.

As current is conveyed through contact layer 22 and intermediate conductive layer 16, thermal energy is created and absorbed by phase change component 13. The long path lengths of layers 16 and 22 provide a high thermal impedance and prevent the heat generated in phase change component 13 from being conducted away from phase change component 13. Thus, phase change component 13 heats to a desirable temperature (e.g., a temperature that will switch phase change component 13 from a first conductivity state to a second conductivity state) with a low voltage input relative to that required by conventional metal contacts.

When phase change component 13 is heated to a sufficient temperature, thermal insulator component 20, which is proximate to phase change component 13, opposite intermediate conductive layer 16, prevents heat from escaping into the environment surrounding electrical and thermal contact 10 and, therefore, prevents heat from escaping phase change component 13.

Thus, electrical and thermal contact 10 effectively contains thermal energy within phase change component 13 of contacted structure 12. Moreover, due to its small surface area relative to that of conventional metal contacts, electrical and thermal contact 10 does not dissipate heat as quickly as conventional metal contacts. Thus, the amount of voltage that is required to effect a thermally induced switching of contacted structure 12 from a first state to a second state is also reduced.

Figure 9:
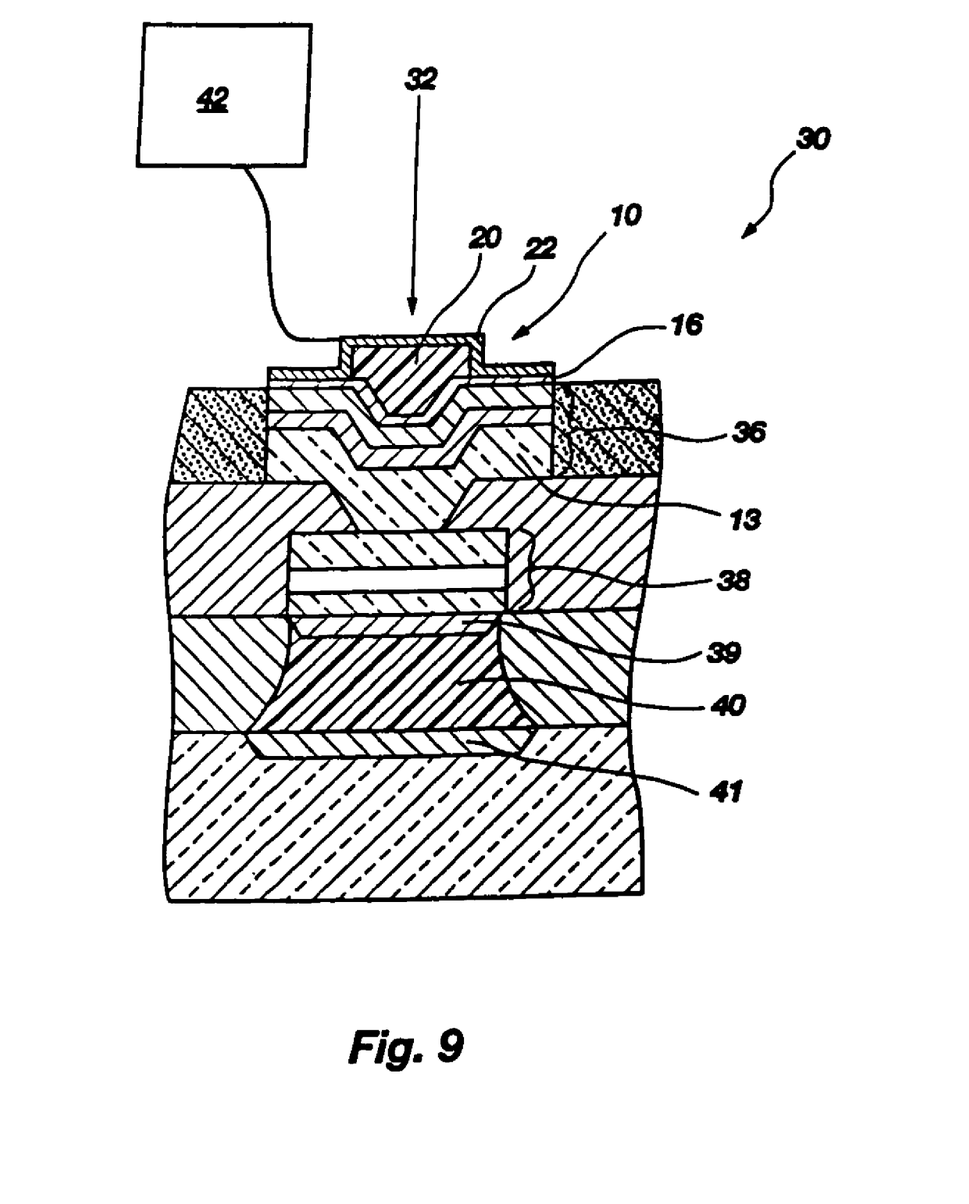
FIG. 9 is a schematic cross-sectional representation of a semiconductor device including a contact according to the present invention which is in contact with a memory element.

FIG. 9 illustrates an exemplary use of electrical and thermal contact 10 in an electrically erasable programmable memory semiconductor device 30, which is also referred to as a semiconductor device for simplicity, that includes a plurality of memory elements 32 (although only a single memory element 32 is illustrated in FIG. 9). Exemplary memory elements 32 with which the electrical and thermal contact 10 of the present invention are particularly useful include those disclosed in the '758 patent. Memory element 32 includes an upper contact electrode 36 and a lower contact electrode 38, both of which may comprise a phase change material. As illustrated, memory element 32 also includes diffusion regions of p-doped isolation channels 39 adjacent lower contact electrode 38 and an n-epitaxial structure 40 adjacent the p-doped isolation channel 39. An n+channel 41, which addresses the individual memory elements 32, is adjacent and in electrical communication with n-epitaxial structure 40. Electrical and thermal contact 10 preferably contacts upper contact electrode 36, which may comprise phase change component 13. Although FIG. 9 illustrates a vertically contacted memory element 32, the electrical and thermal contact 10 of the present invention may also be employed in association with other memory element designs or configurations, as are known to those of skill in the art, as well as with other types of memory devices and other structures that may be fabricated on semiconductor devices and for which an infusion of thermal energy with a reduced, or lower, level of current input may be desired.

With continued reference to FIG. 9, as an example of the use of electrical and thermal contact 10 in programming memory element 32, a programming impulse source 42 is placed into electrical contact with contact layer 22. An electrical current generated by programming impulse source 42 is then conducted through contact layer 22 and intermediate conductive layer 16, and through the phase change component 13 thereof, and causes phase change component 13 to change phase, thereby altering the electrical conductivity characteristics of phase change component 13. Thermal insulator component 20 and low thermal conduction of upper contact electrode 36 prevent the escape of heat from memory element 32. Thus, self-heating of the phase change material of phase change component 13, due in part to the resistivity thereof, heats memory element 32 to a temperature that is sufficient to activate memory element 32 and create a low resistance electrical pathway through memory element 32, thereby switching memory element 32 from an "off" state to an "on" state.

Figure 10:
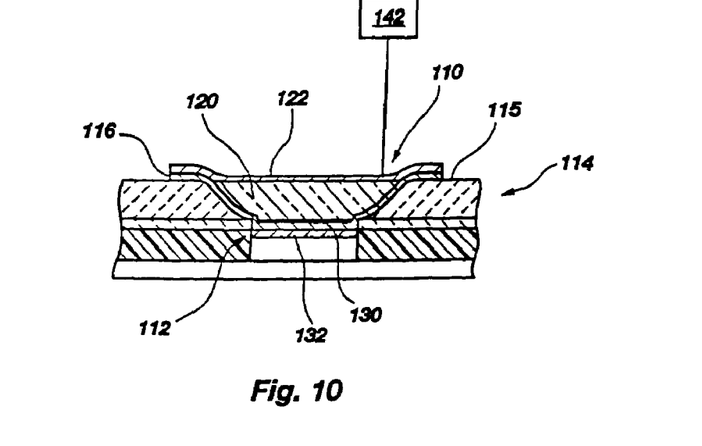
FIGS. 10 and 11 are schematic cross-sectional representations of alternative embodiments of the electrical and thermal contact of the present invention.
Figure 11:
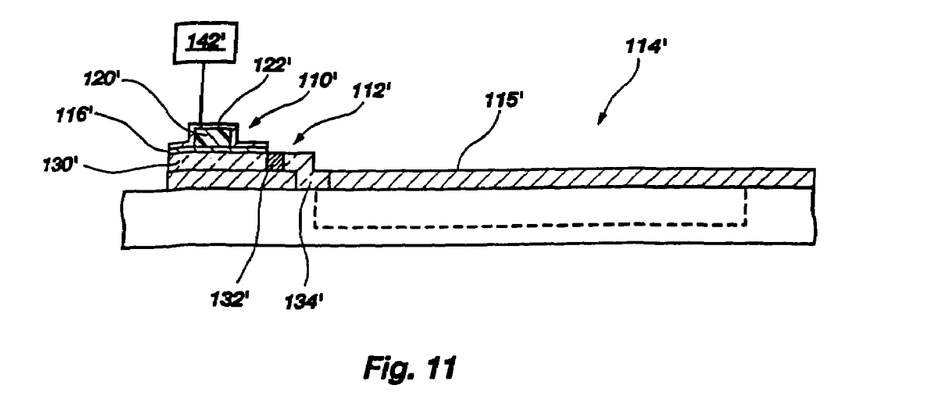

FIGS. 10 and 11 illustrate alternative embodiments of an electrical and thermal contact 110, 110', respectively, which is disposed on a surface 115, 115' of a semiconductor device 114, 114' in electrical contact with a contacted structure, such as a memory element 112, 112' of a type known in the art.

Electrical and thermal contact 110, 110' includes a thin, electrically conductive base layer 116, 116' disposed on surface 115, 115' of semiconductor device 114, 114' and in electrical contact with a first conductive element 130, 130' of memory element 112, 112'. A thermal insulator component 120, 120' of electrical and thermal contact 110, 110' is disposed on base layer 116, 116'. An electrically conductive contact layer 122, 122' is disposed adjacent thermal insulator component 120, 120', and in electrical contact with base layer 116, 116'. Each of the elements of electrical and thermal contact 110, 110' may be fabricated from the materials and by the processes that were discussed above.

Memory element 112, 112' includes a memory cell 132, 132' in electrical contact with first conductive element 130, 130'. Memory cell 132, 132' is fabricated as known in the art from materials such as polysilicon that will undergo a phase change, "rupture," or "fuse" to create a higher or lower electrical resistance pathway upon the application of a minimum predetermined current thereto. Memory element 112' may also include a second electrically conductive element 134' that electrically contacts memory cell 132' (see FIG. 11).

As an example of the use of electrical and thermal contact 110, 110' in programming a memory element 112, 112', a programming impulse source 142, 142' is placed into contact with contact layer 122, 122'. An electrical current that is generated by programming impulse source 142, 142' is then conducted through contact layer 122, 122' to memory element 112, 112'. Heat generated in memory element 112, 112' causes it to switch states. The heat is prevented from leaving the memory element 112, 112' by the low thermal conductivity of electrical and thermal contact 110, 110'.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A contact for a semiconductor device, comprising:
   an intermediate conductive layer contacting and in electrical communication with a structure located at a lower level than a silicon-containing dielectric layer of the semiconductor device;
   an insulator component positioned adjacent said intermediate conductive layer so as to at least thermally insulate said structure; and
   an electrically conductive contact layer adjacent said insulator component and in communication with said intermediate conductive layer.

2. The contact of claim 1, wherein said insulator component is sandwiched between said intermediate conductive layer and said contact layer.

3. The contact of claim 1, wherein said intermediate conductive layer and said contact layer substantially envelop said insulator component.

4. The contact of claim 1, wherein said insulator component comprises an insulator material including at least one of undoped silicon dioxide, doped silicon dioxide, silicon nitride, a thermoset polymer, and a thermoplastic polymer.

5. The contact of claim 1, wherein said intermediate conductive layer comprises an electrically conductive material.

6. The contact of claim 1, wherein said intermediate conductive layer has a thickness of about 200 angstroms or less.

7. The contact of claim 1, wherein said intermediate conductive layer comprises at least one of a refractory metal, a refractory metal nitride, and aluminum.

8. The contact of claim 1, wherein said contact layer has a thickness of about 200 angstroms or less.

9. The contact of claim 1, wherein said contact layer comprises a material having a melting temperature that is greater than a temperature required to switch a phase change component in electrical communication with the contact between a plurality of states.

10. The contact of claim 1, wherein said contact layer comprises at least one of a refractory metal, a refractory metal nitride, and aluminum.

11. A contact for a memory element of a semiconductor device, the memory element including a phase change component, the contact comprising:
    an insulator component comprising a thermally and electrically insulative material;
    an intermediate conductive layer adjacent said insulator component and contacting and in electrical and thermal communication with the memory element; and
    a contact layer adjacent said insulator component and in electrical contact with said intermediate conductive layer, said contact layer and said intermediate conductive layer substantially enveloping said insulator component.

12. The contact of claim 11, wherein said thermally and electrically insulative material comprises at least one of undoped silicon dioxide, doped silicon dioxide, silicon nitride, a thermoset resin, and a thermoplastic polymer.

13. The contact of claim 11, wherein said intermediate conductive layer comprises an electrically conductive material.

14. The contact of claim 11, wherein said intermediate conductive layer has a thickness of about 200 angstroms or less.

15. The contact of claim 11, wherein said intermediate conductive layer comprises a material having a melting temperature that is greater than a temperature that is required to switch a phase change material of the phase change component from a first state to a second state.

16. The contact of claim 11, wherein said intermediate conductive layer comprises at least one of a refractory metal, a refractory metal nitride, and aluminum.

17. The contact of claim 11, wherein said contact layer has a thickness of about 200 angstroms or less.

18. The contact of claim 11, wherein said contact layer comprises a material having a melting temperature that is greater than a temperature that is required to switch a phase change material of the phase change component from a first state to a second state.

19. The contact of claim 11, wherein said contact layer comprises at least one of a refractory metal, a refractory metal nitride, and aluminum.

20. A contact for a semiconductor device including a contact layer and an intermediate conductive layer which partially contact one another and substantially envelop an insulator component, the contact contacting a structure located at a lower level than a silicon-containing dielectric layer of the semiconductor device so as to at least thermally insulate the structure, the contact fabricated by the process comprising:
    forming the intermediate conductive layer on a surface of the semiconductor device and in electrical thermal communication with an active device region of the semiconductor device;
    depositing a dielectric layer on the intermediate conductive layer;
    patterning said dielectric layer to define the insulator component;
    forming the contact layer substantially over an exposed area of the insulator component and in electrical communication with the intermediate conductive layer;
    patterning the intermediate conductive layer; and
    patterning the contact layer.

21. The contact of claim 20, wherein said forming the intermediate conductive layer comprises disposing a conductive material in electrical and thermal communication with a phase change component of said active device region.

22. The contact of claim 20, wherein said forming the intermediate conductive layer comprises forming a thermally conductive material layer having a thickness of about 200 angstroms or less.

23. The contact of claim 20, wherein said forming the intermediate conductive layer comprises depositing a thermally conductive material.

24. The contact of claim 20, wherein said patterning said dielectric layer comprises etching and employs the intermediate conductive layer as an etch stop.

25. The contact of claim 20, wherein said forming the contact layer comprises forming an electrically conductive material layer having a thickness of about 200 angstroms or less.

26. The contact of claim 20, wherein said forming the contact layer comprises depositing an electrically conductive material.

27. An electrically erasable programmable memory device, comprising:
a memory element including an electrode adjacent a memory cell, at least one of said electrode and said memory cell comprising a phase change material; and
a contact including an intermediate conductive layer contacting and in electrical and thermal communication with said memory element, an insulator component adjacent said intermediate conductive layer, and a contact layer adjacent said insulator component and in electrical communication with said intermediate conductive layer.

28. The electrically erasable programmable memory device of claim 27, wherein said intermediate conductive layer contacts said electrode.

29. The electrically erasable programmable memory device of claim 27, wherein said contact layer and said intermediate conductive layer substantially envelop said insulator component.

30. The electrically erasable programmable memory device of claim 27, wherein said insulator component is sandwiched between said contact layer and said intermediate conductive layer.

31. The electrically erasable programmable memory device of claim 27, wherein said contact layer has a thickness of about 200 angstroms or less.

32. The electrically erasable programmable memory device of claim 27, wherein said intermediate conductive layer has a thickness of about 200 angstroms or less.

33. A semiconductor device including at least one contact, the at least one contact comprising:
an intermediate conductive layer contacting and in electrical and thermal communication with a structure of the semiconductor device comprising a phase change component;
an insulator component disposed adjacent said intermediate conductive layer; and
a contact layer adjacent said insulator component and in electrical communication with said intermediate conductive layer.

34. The semiconductor device of claim 33, wherein said insulator component is sandwiched between said intermediate conductive layer and said contact layer.

35. The semiconductor device of claim 32, wherein said intermediate conductive layer and said contact layer substantially envelop said insulator component.

36. The semiconductor device of claim 33, wherein said insulator component comprises a thermally insulative material.

37. The semiconductor device of claim 33, wherein said intermediate conductive layer comprises an electrically conductive material.

38. The semiconductor device of claim 33, wherein said intermediate conductive layer has a thickness of about 200 angstroms or less.

39. The semiconductor device of claim 33, wherein said intermediate conductive layer comprises a material having a melting temperature that is greater than a temperature that is required to switch a phase change material of a contacted structure between a plurality of states.

40. The semiconductor device of claim 33, wherein said intermediate conductive layer comprises at least one of a refractory metal, a refractory metal nitride, and aluminum.

41. The semiconductor device of claim 33, wherein said contact layer has a thickness of about 200 angstroms or less.

42. The semiconductor device of claim 33, wherein said contact layer comprises a material having a melting temperature that is greater than a temperature that is required to switch a phase change material of a contacted structure between a plurality of states.

43. The semiconductor device of claim 33, wherein said contact layer comprises at least one of a refractory metal, a refractory metal nitride, and aluminum.

44. An enhanced electrically erasable programmable element including a contact comprising:
an intermediate conductive layer contacting and in electrical communication with the electrically erasable programmable element;
an insulator component disposed adjacent said intermediate conductive layer and over the electrically erasable programmable element so as to insulate same; and
an electrically conductive contact layer adjacent said insulator component.

45. The enhanced electrically erasable programmable element of claim 44, wherein said insulator component is sandwiched between said intermediate conductive layer and said contact layer.

46. The enhanced electrically erasable programmable element of claim 44, wherein said intermediate conductive layer and said contact layer substantially envelop said insulator component.

47. The enhanced electrically erasable programmable element of claim 44, wherein said insulator component comprises a thermally insulative material.

48. The enhanced electrically erasable programmable element of claim 44, wherein said insulator component comprises thermally insulative material including at least one of undoped silicon dioxide, doped silicon dioxide, silicon nitride, a thermoset resin, and a thermoplastic polymer.

49. The enhanced electrically erasable programmable element of claim 44, wherein said intermediate conductive layer comprises an electrically conductive material.

50. The enhanced electrically erasable programmable element of claim 44, wherein said intermediate conductive layer has a thickness of about 200 angstroms or less.

51. The enhanced electrically erasable programmable element of claim 44, wherein said intermediate conductive layer comprises a material having a melting temperature that is greater than a temperature that is required to switch a phase change material of a contacted structure between a plurality of electrical conductivity states.

52. The enhanced electrically erasable programmable element of claim 45, wherein said intermediate conductive layer comprises at least one of a refractory metal, a refractory metal nitride, and aluminum.

53. The enhanced electrically erasable programmable element of claim 44, wherein said contact layer has a thickness of about 200 angstroms or less.

54. The enhanced electrically erasable programmable element of claim 44, wherein said contact layer comprises a material having a melting temperature that is greater than a temperature that is required to switch a phase change material of a contacted structure between a plurality of states.

55. The enhanced electrically erasable programmable element of claim 44, wherein said contact layer comprises at least one of a refractory metal, a refractory metal nitride, and aluminum.

56. The contact of claim 1, wherein at least one of said intermediate conductive layer and the electrically conductive contact layer abuts a major surface of said silicon-containing dielectric layer.

57. The contact of claim 1, wherein said structure comprises a phase change component.

58. The contact of claim 57, wherein said intermediate conductive layer comprises a material having a melting temperature that is greater than a temperature required to switch a phase change component in electrical communication with the contact between a plurality of states.

59. The contact of claim 20, wherein at least one of said intermediate conductive layer and said contact layer abuts a major surface of said silicon-containing dielectric layer.

60. The contact of claim 20, wherein said structure comprises a phase change component.

* * * * *

UNITED STATES PATENT AND TRADEMARK OFFICE
CERTIFICATE OF CORRECTION

PATENT NO.       : 7,173,317 B1  
APPLICATION NO.  : 09/189098  
DATED            : February 6, 2007  
INVENTOR(S)      : Reinberg Page 1 of 1

It is certified that error appears in the above-identified patent and that said Letters Patent is hereby corrected as shown below:

Column 11, line 48, in Claim 35, delete "claim 32," and insert -- claim 33, --, therefor.

Column 12, line 52, in Claim 52, delete "claim 45," and insert -- claim 44, --, therefor.

Signed and Sealed this

First Day of April, 2008

JON W. DUDAS  
*Director of the United States Patent and Trademark Office*